United States Patent
Nishida

[11] Patent Number: 6,156,150
[45] Date of Patent: Dec. 5, 2000

[54] IC COMPONENT SEPARATING METHOD AND SEPARATING APPARATUS

[75] Inventor: Kazuto Nishida, Katano, Japan

[73] Assignee: Matsushita Electric Industrial Co., Ltd., Kadoma, Japan

[21] Appl. No.: 09/171,183

[22] PCT Filed: Apr. 16, 1997

[86] PCT No.: PCT/JP97/01307

§ 371 Date: Oct. 14, 1998

§ 102(e) Date: Oct. 14, 1998

[87] PCT Pub. No.: WO97/39611

PCT Pub. Date: Oct. 23, 1997

[30] Foreign Application Priority Data

Apr. 16, 1996 [JP] Japan ................................. 8-093708

[51] Int. Cl.[7] .................................................. B32B 35/00
[52] U.S. Cl. .................... 156/344; 156/584; 156/94; 29/402.08; 29/426.5; 29/762
[58] Field of Search .................... 156/344, 584, 156/94; 29/402.03, 402.08, 426.1, 426.3, 426.5, 762; 228/191, 264

[56] References Cited

U.S. PATENT DOCUMENTS

| | | | |
|---|---|---|---|
| 4,274,576 | 6/1981 | Shariff | 228/264 |
| 4,832,250 | 5/1989 | Spigarelli et al. | 228/102 |
| 4,909,428 | 3/1990 | Mermet-Guyennet | 228/6.2 |
| 5,065,933 | 11/1991 | Basavanhally | 228/102 |
| 5,072,874 | 12/1991 | Bertram et al. | 228/264 |
| 5,423,931 | 6/1995 | Inoue et al. | 156/94 |
| 5,758,817 | 6/1998 | Chapman | 228/264 |
| 5,769,989 | 6/1998 | Hoffmeyer et al. | 156/94 |

FOREIGN PATENT DOCUMENTS

| | | |
|---|---|---|
| 53-66571 | 6/1978 | Japan . |
| 56-83927 | 7/1981 | Japan . |
| 62-6652 | 2/1987 | Japan . |
| 63-31573 | 3/1988 | Japan . |
| 63-142895 | 6/1988 | Japan . |
| 4-76929 | 3/1992 | Japan . |
| 4-302444 | 10/1992 | Japan . |
| 4-318947 | 11/1992 | Japan . |

*Primary Examiner*—Mark A. Osele
*Attorney, Agent, or Firm*—Wenderoth, Lind & Ponack, L.L.P.

[57] ABSTRACT

A method and apparatus for separating an IC component (1) from a board (3). The method includes the processes of positioning a tool (21) just above the IC component, thereafter moving the tool down into a specified position, making the tool cover the IC component that is mounted on the board via an adhesive material, solder, or paste, and separating the IC component from the board by turning the tool. Through these processes, the IC component can be separated with a relatively small force, so that cracking of the IC component and damage to the board can be suppressed to a minimum.

23 Claims, 19 Drawing Sheets

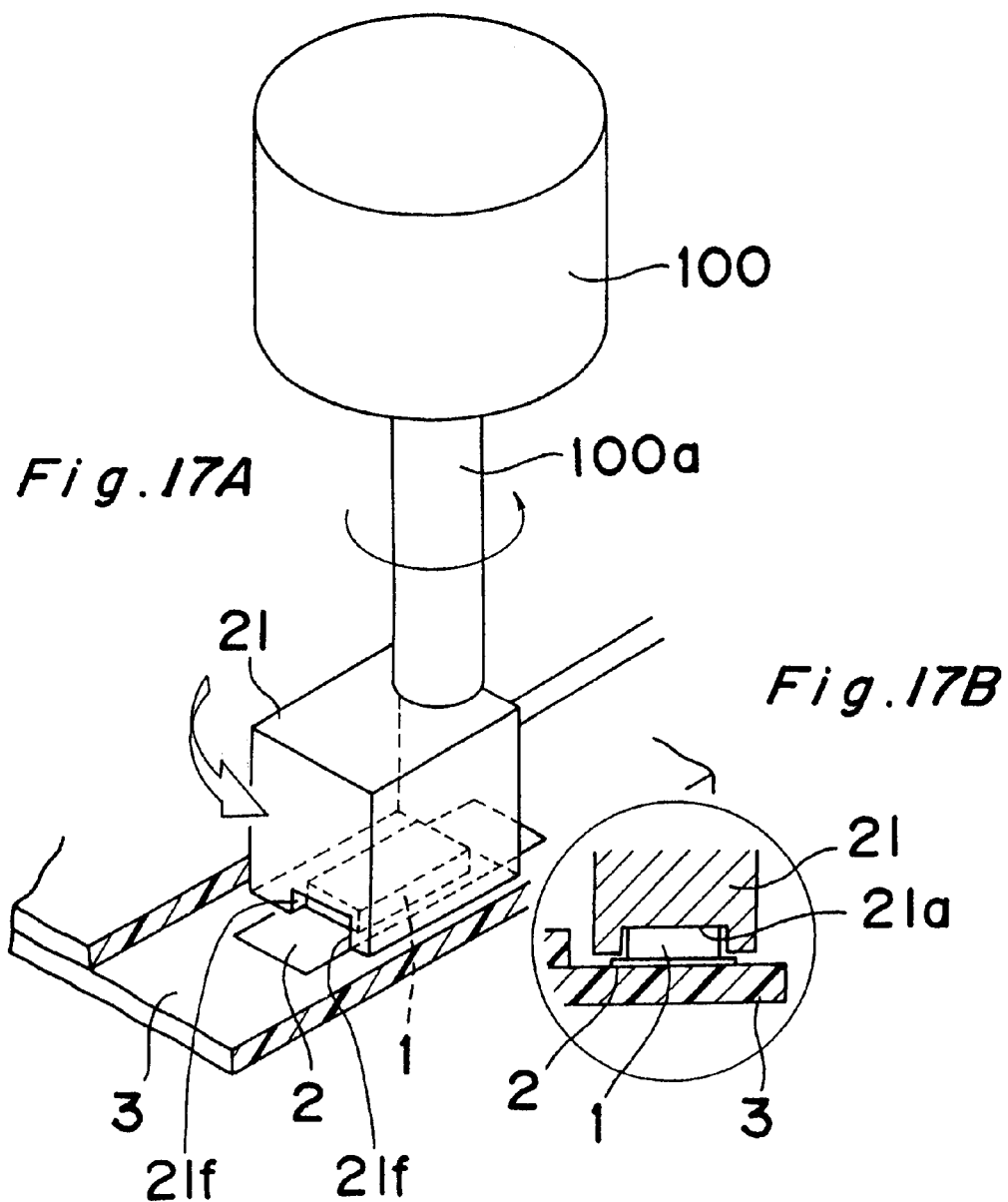

IC COMPONENT SEPARATING METHOD AND SEPARATING APPARATUS

BACKGROUND OF THE INVENTION

1. Technical Field

The present invention relates to a separating method and separating apparatus for separating an IC (Integrated Circuit) component mounted on a board of a flat panel display such as an LCD (Liquid Crystal Display Device) and a plasma display or a printed board for an electronic circuit from the board.

2. Description of Related Art

Lately, flat panel displays have been used for many products by virtue of their compactness and the like, and their performances are improving day by day, so that low-price high-performance products employing flat panel displays are appearing. Flip-chip mounting, CSP (Chip Size Package), BGA (Ball Grid Array) and so on employing a bare IC chip are increasingly used for electronic circuits responding to the demand for the compacting of the circuits.

The IC components mounted on the boards of electronic equipment and flat panel displays include a certain number of defectives, and for the reason of a failure in mounting, it is required to perform repair by removing the IC components. Attempting an improvement in productivity of repair is an important subject.

As a prior art method for bonding an IC component onto the board of a flat panel display and the printed board of electronic equipment, Japanese Examined Patent Publication No. 62-6652 and so on disclose the flip-chip system bonding method of interposing an anisotropic conductive film on the electrodes of the board of a flat panel display, mounting an IC component on the film and bonding the component by performing a thermocompression bonding by means of a pressurizing tool. Japanese Unexamined Laid-Open Patent Publication No. 4-302444 and so on disclose the contents of the bonding method.

In general, as a method for bonding the electrodes of the board of a flat panel display and the bumps of an IC component together, there is performed the processes of holding the board of the flat panel display on a stage, mounting the IC component on the board of the flat panel display and performing thermocompression bonding. Normally, in an attempt at improving the productivity, the thermocompression bonding of the board of the flat panel display and the IC component is performed substantially in one process, through which the adhesive of an anisotropic conductive film has been hardened for the completion of bonding.

However, the IC components used in this case include a certain number of defectives, and the defective IC components have been repaired in the subsequent process. Particularly when mounting an IC in a bare state by the flip-chip system, the necessity of this repair work becomes significant since the IC characteristic test cannot be sufficiently performed. In particular, the fraction of defective products becomes proportional to the exponentiation of the defectives of IC components, and therefore, in a high-resolution display (having many lines), the drive use IC components to be bonded increase in number, meaning that the repair is the important subject.

As shown in FIG. 14A and FIG. 14B, when an IC component 1 is bonded by compression bonding, the IC component is firmly bonded to a board 3 comprised of the board of the flat panel display or of a circuit board by an anisotropic conductive film 2. Therefore, when performing repair from this state, the conventional manner has had the steps of removing the IC component 1 from the board 3 by means of a spatula-shaped jig 11 (see FIG. 14A) or tweezers 12 (see FIG. 14B), softening the anisotropic conductive film 2 by means of a solvent 13 and removing the anisotropic conductive film 2 from the board 3 by scraping away the film 2 by means of a cotton swab 14 as shown in FIG. 14C.

However, with the jig 11 or the tweezers 12, a strong force is locally applied to the IC component 1, and this has generated cracks in the IC component 1 and damage to the board 3.

In the case of an IC component whose bumps are bonded by means of an Ag conductive paste or solder, the removal of the IC component has been difficult after performing sealing.

As disclosed in the prior art reference of Japanese Patent Laid-Open Publication No. HEI 4-76929, it is possible to test the adhesive in a semi-hardened state and perform repair as shown in FIG. 14B. However, when the sealing material is introduced into a space between the IC component and the circuit after the test, it is very difficult to repair any occurring defects.

As shown in FIG. 15, in the case of the IC component 1 of BGA or the like, balls 4 located on the board 3 side and on an IC component 1a side are connected generally by solder 5. In such a case, it is difficult to physically separate the IC component with a force applied in this state. If it is attempted to indirectly melt the solder by heating a tool for bonding the IC component 1, then a considerable time has been consumed due to the bad heat conductivity of the IC component 1, resulting in a low productivity.

Accordingly, the object of the present invention is to provide an IC component separating method and separating apparatus capable of easily separating an IC component from a board when separating the IC component from the board after bonding the IC component to a circuit board, a flat panel display board or the like.

SUMMARY OF THE INVENTION

In order to solve the aforementioned problems, the present invention is constructed as follows.

According to a first aspect of the present invention, there is provided an IC component separating method for separating an IC component mounted via a bonding intervenient on a board from the board, comprising of:

making at least a pair of opposite contact surfaces that are formed on a tool and contact the IC component mounted on the board;

softening the bonding intervenient by heating the IC component or a bonded portion of the IC component and the board; and separating the IC component from the board by turning the tool so as to twist the tool relative to a bonded surface on which the IC component is bonded to the board.

According to a second aspect of the present invention, there is provided an IC component separating method based on the first aspect, wherein the bonding intervenient is an anisotropic conductive film.

According to a third aspect of the present invention, there is provided an IC component separating method based on the first or second aspect, wherein the contact surfaces of the tool is made to contact the IC component with the tool heated, the bonding intervenient is softened by heating the IC component or the bonded portion of the IC component and the board through heat conduction from the tool, and then the IC component is separated from the board by turning the tool so as to twist the tool with respect to the bonded surface on which the IC component is bonded to the board.

According to a fourth aspect of the present invention, there is provided an IC component separating method based on any one of the first through third aspects, wherein the IC component is attracted by vacuum suction from the tool when separating the IC component from the board by turning the tool.

According to a fifth aspect of the present invention, there is provided an IC component separating method based on any one of the first through fourth aspects, wherein the IC component or a bonded portion of the IC component and the board is heated with infrared light from a rear surface of an IC component mounting surface of the board when separating the IC component from the board by turning the tool.

According to a sixth aspect of the present invention, there is provided an IC component separating method based on the fifth aspect, wherein a shield plate having an opening is arranged between an infrared light applying device and the board, and the infrared light is applied through the opening to only the bonded portion to be separated when heating the IC component or the bonded portion with infrared light.

According to a seventh aspect of the present invention, there is provided an IC component separating method based on any one of the first through sixth aspects, wherein a center of rotation of the tool is eccentric relative to a center of the IC component when separating the IC component from the board while turning the tool.

According to an eighth aspect of the present invention, there is provided an IC component separating method based on any one of the first through seventh aspects, wherein the board moves so that the board does not hinder the turning operation of the tool when the tool comes in contact with the board during the turning of the tool when separating the IC component from the board while turning the tool.

According to a ninth aspect of the present invention, there is provided an IC component separating apparatus for separating an IC component mounted on a board from the board, comprising:

a tool formed with a contact portion that contacts the IC component and is able to move in a direction in which the IC component moves close to or apart from the board and turn so as to twist relative to a bonded surface on which the IC component is bonded to the board; and a heating device for heating the IC component or the bonding intervenient that bonds the IC component to the board, wherein the contact surface of the tool is made to contact the IC component mounted on the board, the bonding intervenient is softened by heating the IC component or the bonded portion of the IC component and the board by means of the heating device, and the IC component is separated from the board by turning the tool so as to twist the tool with respect to the bonded surface on which the IC component is bonded to the board.

According to a tenth aspect of the present invention, there is provided an IC component separating apparatus based on the ninth aspect, wherein the heating device is provided for the tool and heats the IC component or the bonded portion of the IC component and the board through heat conduction from the tool, the bonding intervenient is softened by this heating, and the IC component is separated from the board by turning the tool so as to twist the tool with respect to the bonded surface on which the IC component is bonded to the board.

According to an eleventh aspect of the present invention, there is provided an IC component separating apparatus based on the tenth aspect, wherein the heating device is an infrared light applying device for heating the IC component and the bonding intervenient of the IC component with infrared light from a rear surface of the board.

According to a twelfth aspect of the present invention, there is provided an IC component separating apparatus based on any one of the ninth through eleventh aspects, wherein the tool is provided with a suction device that is able to make a negative pressure inside the tool and to suck the IC component or the bonding intervenient.

According to a thirteenth aspect of the present invention, there is provided an IC component separating apparatus based on any one of the ninth through twelfth aspects, wherein a center of rotation of the tool is eccentric relative to a center of the IC component when separating the IC component from the board while turning the tool.

According to a fourteenth aspect of the present invention, there is provided an IC component separating apparatus based on any one of the ninth through thirteenth aspects, comprising a retreating mechanism for moving the board so that the board does not hinder the turning operation of the tool when the tool comes in contact with the board while the tool turns when separating the IC component from the board while turning the tool.

The above tool is only required to be provided with the contact portion to contact the IC component and be able to move in a direction in which the IC component moves close to or apart from the board and to turn so as to twist relative to the bonded surface on which the IC component is bonded to the board.

According to the above separating method, the bonding intervenient is softened by heating the IC component or the bonded portion of the IC component and the board, and the IC component is separated while being twisted by the tool relative to the bonded surface on which the IC component is bonded to the board, and therefore, the IC component can be separated from the board with a relatively small force.

By making the heated tool cover the IC component, the bonding intervenient of the IC component and the board is softened, and therefore, the IC component can be more easily separated from the board.

If the IC component is attracted by vacuum suction from the tool when separating the IC component from the board by turning the tool, then the IC component is sucked to the tool. This facilitates easy disposal of the IC component that has been sucked and removed, thereby improving the work efficiency. The IC component is removed from the board when turning the IC component, and therefore, the bonding intervenient adhered on the IC component can be prevented from spattering onto the board during the turn.

If the IC component or the bonding intervenient is heated with infrared light from the rear surface of the IC component bonding surface of the board when separating the IC component from the board by turning the tool, the bonding intervenient of the IC component and the board can be softened, and therefore, the IC component can be more easily separated from the board.

Furthermore, by arranging the shield plate having the opening between the infrared light applying device and the board and applying infrared light to only the bonded portion to be separated through the opening when heating the IC component or the bonding intervenient with infrared light, only the portion corresponding to the opening can be heated via the shield plate, and therefore, this method can also be applied to fine IC components.

When heating the IC component as well as the bonding intervenient of the board and the IC component with heated air from inside the tool and separating the IC component from the board by turning the tool, it is preferable to stop the heated air when the bonding intervenient is softened or melted.

When mounting an IC component onto the board and thereafter separating the IC component by attaching the tape-shaped adhesive member to the IC component to remove the IC component from the board, the IC component can be more easily removed by attaching the tape-shaped adhesive member to the IC component and thereafter separating the IC component while heating the IC component or its bonding intervenient with infrared light on the rear surface side of the IC component bonding surface of the board. member to the IC component and thereafter separating the IC component while heating the IC component or its bonding intervenient with infrared light on the rear surface side of the IC component bonding surface of the board.

BRIEF DESCRIPTION OF DRAWINGS

These and other aspects and features of the present invention will become clear from the following description taken in conjunction with the preferred embodiments thereof with reference to the accompanying drawings, in which:

FIG. 17A and FIG. 17B are respectively a schematic perspective view and a partial sectional view showing an IC component separating method according to the sixth embodiment;

DETAILED DESCRIPTION OF

Figures 1A, 1B:
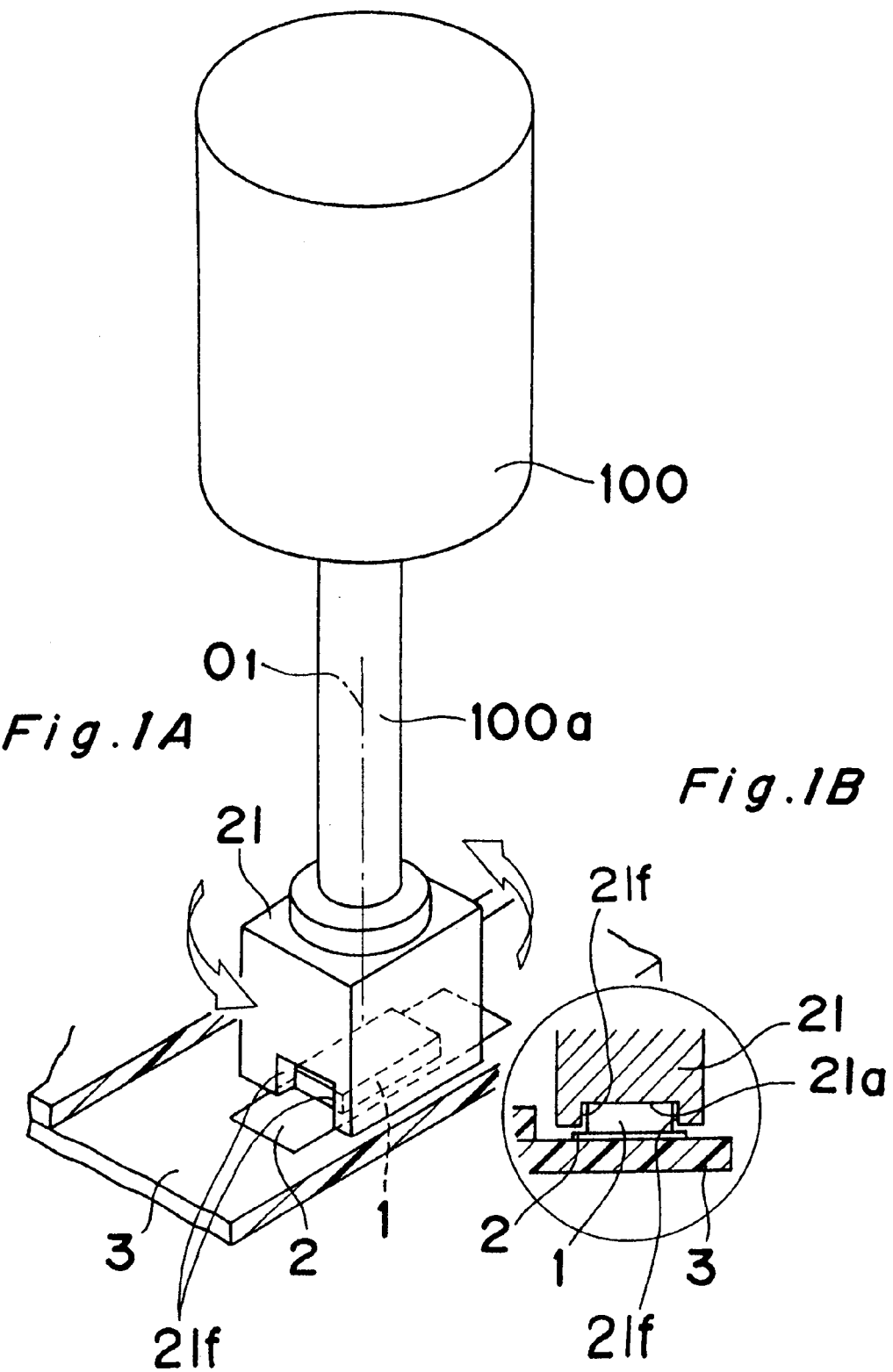
FIG. 1A and FIG. 1B are respectively a schematic perspective view and a partial sectional view showing an IC component separating method according to a first embodiment of the present invention.

Before the description of the present invention proceeds, it is to be noted that like parts are designated by like reference numerals throughout the accompanying drawings.

The following will describe the IC component separating method and apparatus according to various embodiments of the present invention with reference to the drawings. It is to be noted that the same components as those of the prior art are denoted by the same reference numerals, and no description is provided for them.

First, the IC component separating method and apparatus according to a first embodiment of the present invention will be described with reference to FIG. 1 through FIG. 3.

As shown in FIG. 1A and FIG. 1B, a concave tool 21 serving as an example of a tool to be used for the present separating method is provided with a concave portion 21*a* located at the center of the lower surface thereof so as to have a pair of contact surfaces 21*f*, or contact portions that are arranged opposite to each other to contact a pair of opposite surfaces of an IC component 1, and the tool 21 is able to move in the vertical direction and to pivot around a vertical axial center $O_1$. The IC component 1 is mounted on the board 3 comprised of a flat panel display board or a circuit board by an anisotropic conductive film 2 in this case. The mounted state in this case is not the completely compression-bonded state in which the anisotropic conductive film is completely hardened but a temporarily compression-bonded state in which the anisotropic conductive film is not completely hardened. In the present embodiment, the tool 21 is driven to rotation by a rotary shaft 100*a* of a motor 100, and the center of rotation (vertical axial center $O_1$) roughly coincides with the center of the IC component 1.

Figure 2:
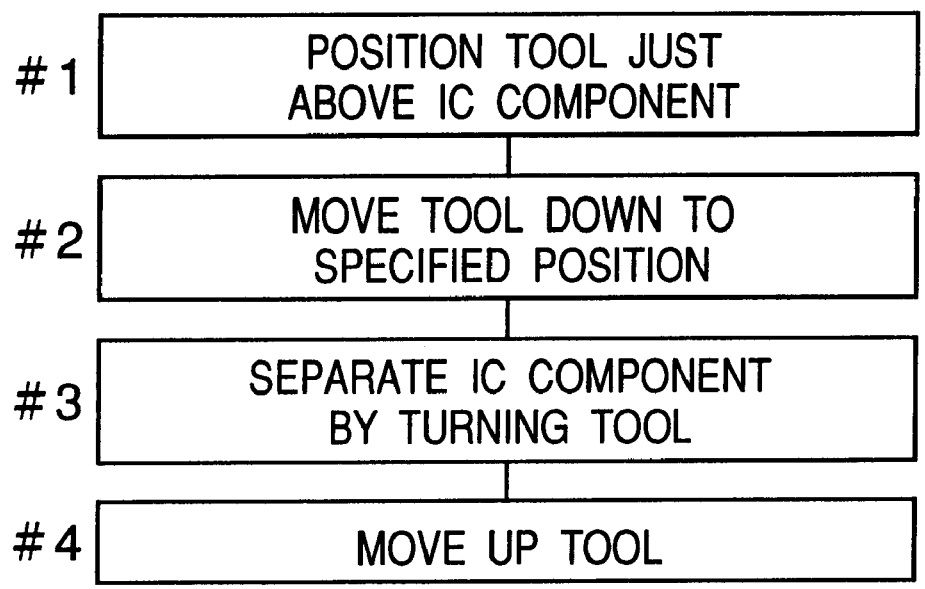
FIG. 2 is a flowchart showing the IC component separating method according to the first embodiment.
Figure 3A:
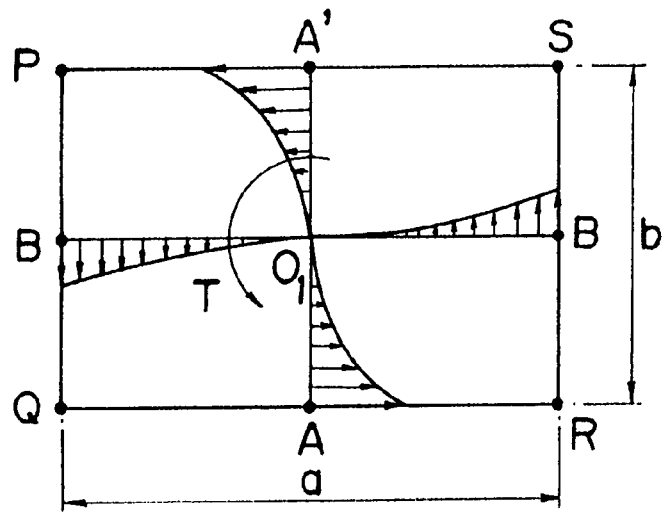
FIG. 3A and FIG. 3B are model charts used for calculating a separation force of the separating method of the first embodiment.
Figure 3B:
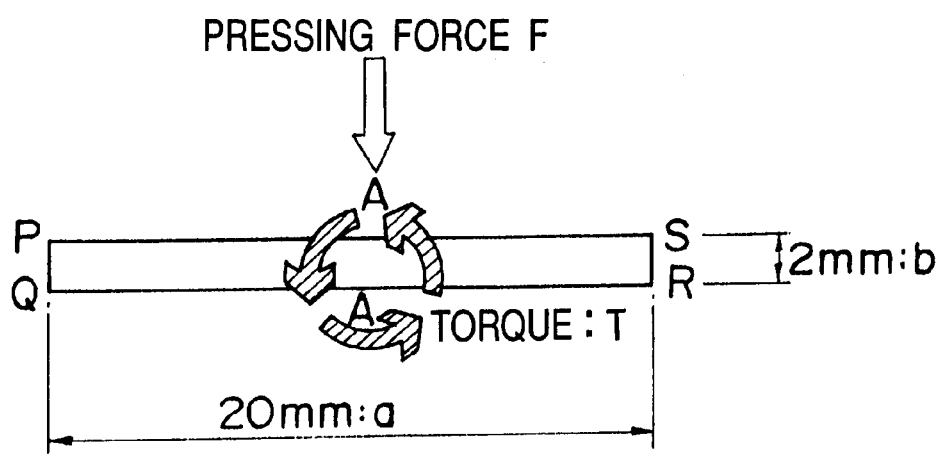

When separating the IC component 1 from the board 3, there are performed the processes of positioning the concave tool 21 just above the IC component 1 in step #1 in FIG. 2, thereafter moving the concave tool 21 down into a specified position to make the concave tool 21 cover the IC component 1 mounted on the board 3 via an adhesive, solder, or conductive paste (step #2), and turning the concave tool 21 around the vertical axial center $O_1$ in a state in which the contact surfaces 21f of the concave tool 21 contact the opposite surfaces of the IC component 1 (step #3), thereby separating the IC component 1 from the board 3. Subsequently, the concave tool 21 is moved up to separate from the IC component 1 (step #4). Preferably, in order not to damage the board 3 by the contact of the concave tool 21 with the board 3, it is appropriate to use a concave portion 21a of which the depth is adjusted so that the lower end surface of the concave tool 21 does not come in contact with the board 3. In order to prevent the IC component 1 from separating from the concave portion 21a of the tool 21 when separating the IC component 1 from the board 3 by rotating the IC component 1 by the tool 21, the depth of the concave portion 21a is required to have such a dimension that at least one half of the height of the IC component 1 enters the concave portion. Preferably, the tool 21 may be pressed by providing an urging portion for a support portion (not shown), the rotary shaft 100a of the motor 100 or the like.

Figure 14A:
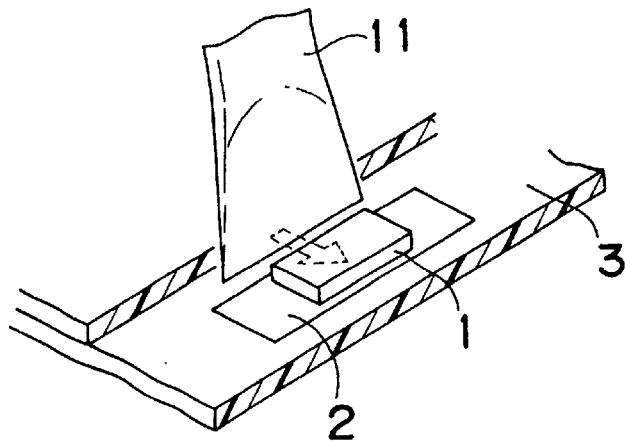
FIG. 14A, FIG. 14B, and FIG. 14C are schematic perspective views showing the prior art IC component separating methods, respectively.
Figure 14B:
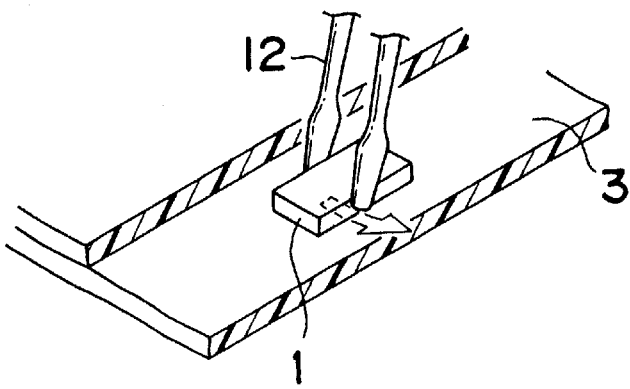
Figure 14C:
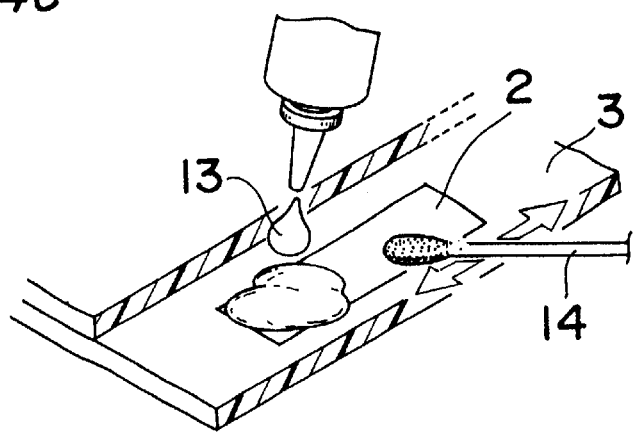
Figure 15:
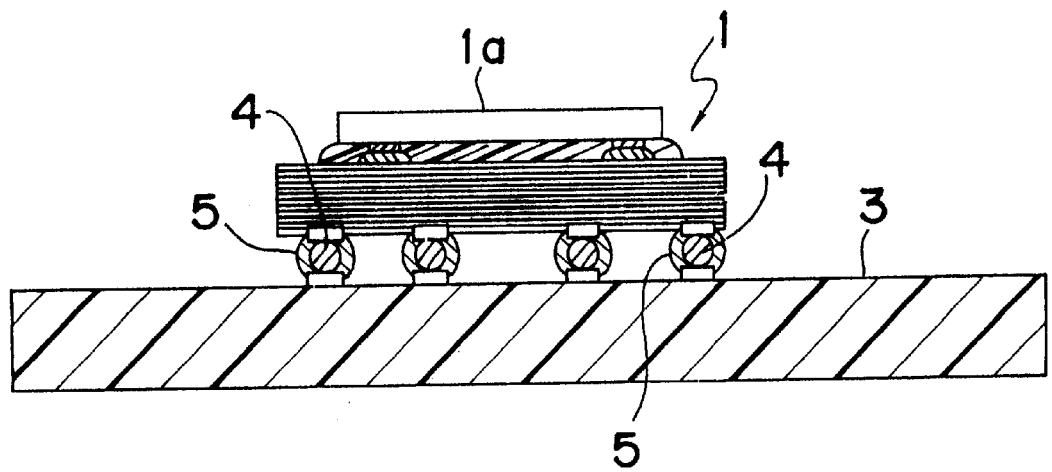
FIG. 15 is a longitudinal sectional view showing the prior art BGA component separating method.

Comparing this turning separation (see FIG. 3A and FIG. 3B) to the pushing separation as stated in connection with the prior art shown in FIG. 14A, the following results.

It is herein assumed, as a precondition of calculation, that an IC component 1 of 20×2 mm is used. A twisting stress: $\tau_{max}$ is generated at a point A on a longer side "a" and is expressed by the following equation:

$$\tau_{max} = \tau_A = T/(K \cdot a \cdot b^2)$$

where T is torque, K is a shear modulus, "a" is the length of the longer side, and "b" is the length of the shorter side.

Therefore, the torque: T is expressed by the following equation:

$$T = K \cdot a \cdot b^2 \cdot \tau_{max}$$

where, by substituting $\tau_{max} = F/a/b$ into the above equation, there is obtained:

$$T = K \cdot b \cdot F$$

where F is the shear modulus for pulling and sliding the IC component to separate the IC component 1 from the board 3.

TABLE 1 a/b of Rectangular Sectional Area and Value of Coefficient K

| a/b | 1.0 | 1.25 | 1.5 | 2.0 | 3.0 | 4.0 |
|---|---|---|---|---|---|---|
| K | 0.208 | 0.221 | 0.231 | 0.246 | 0.267 | 0.282 |
| a/b | 5.0 | 6.0 | 8.0 | 10.0 | 3.0 | 4.0 |
| K | 0.290 | 0.299 | 0.307 | 0.312 | 0.267 | 0.282 |

From Table 1, a/b=10 in the above model.

Therefore, K=0.312. On the other hand, since a force of not smaller than 10 kgf is necessary for pulling and sliding the IC component 1 for separation by a shear force according to experimental data, if it is assumed that F=10 kgf and respective constants are substituted into the above equation, then the equation becomes:

T=0.312×2×10=6.24 kgf·mm. A distance from the center of rotation of the concave tool 21 to the motor for driving this concave tool 21 is assumed to be 51 mm and T is divided for conversion into a force, then there is:

$$F' = 6.24/51 = 0.1224 \text{ kgf}.$$

Consequently, F:F'=82:1. Therefore, the separation can be effected with rotative separation strength being 1/82 that of the push test.

Figure 4:
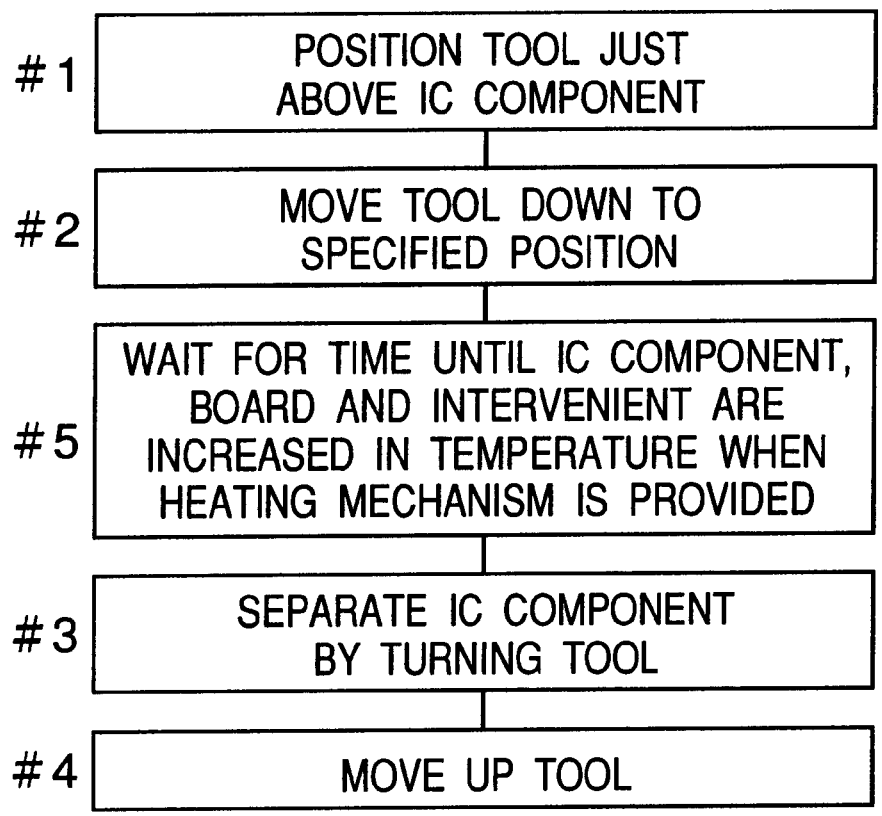
FIG. 4 is a flowchart showing a mounting process of the IC component separating method according to a modification example of the first embodiment.

More preferably, as shown in step #5 in FIG. 4, by heating the concave tool 21 and making this heated concave tool 21 cover the IC component 1, the IC component 1 and the anisotropic conductive film 2 are heated by heat conduction to soften the anisotropic conductive film 2. Then, by rotating the concave tool 21 in this state, the IC component 1 is separated from the board 3. As described above, by heating the concave tool 21, the IC component can be more easily separated even in the state in which the anisotropic conductive film 2 is completely hardened (i.e., in the aforementioned completely compression-bonded state). Its experimental data are shown in Table 2.

TABLE 2

Relation between Temperature of LSI Separating Concave Tool and Separation Strength after Complete Compression-Bonding

| Anisotropic Conductive Film Product Name | Concave Tool Temperature | | | |
|---|---|---|---|---|
| | 25° C. (R, T) | 100° C. | 175° C. | 250° C. |
| AC-830IZX-2-c produced by Hitachi Chemical Co., Ltd. | 5.95 | 5.85 | 3.85 | 0.6 |
| Chip Cracking | x | x | x | o |
| CP84301Q produced by Sony Chemicals Corp. | 4.9 | 5.6 | 3.15 | 0.9 |
| Chip Cracking | x | x | x | o |

(Unit: kgf) Cracked: x Not Cracked: o

The above data are those in the case where the anisotropic conductive film 2 is used for bonding the IC component 1 to the board 3. When the temperature of the concave tool 21 was increased to 250° C., the IC component 1 was able to be easily separated even after the complete compression bonding. However, according to the prior art separating method shown in FIG. 14A, cracks were generated in all of the ICs or boards that were used for the experiment.

As described above, the IC component 1 can be separated with a relatively small force, and therefore, cracking of the IC component 1 and damage to the board 3 can be suppressed to a minimum.

A second embodiment of the present invention will be described next with reference to FIG. 5A, FIG. 5B and FIG. 6. It is to be noted that the same components and procedures as those of the first embodiment are denoted by the same reference numerals and no description is provided for them. In the second embodiment, the concave portion 21a of the tool 21 is provided with a contact section 21f that contacts four side surfaces of the IC component 1 so as to cover the IC component 1 from four directions.

Figure 5:
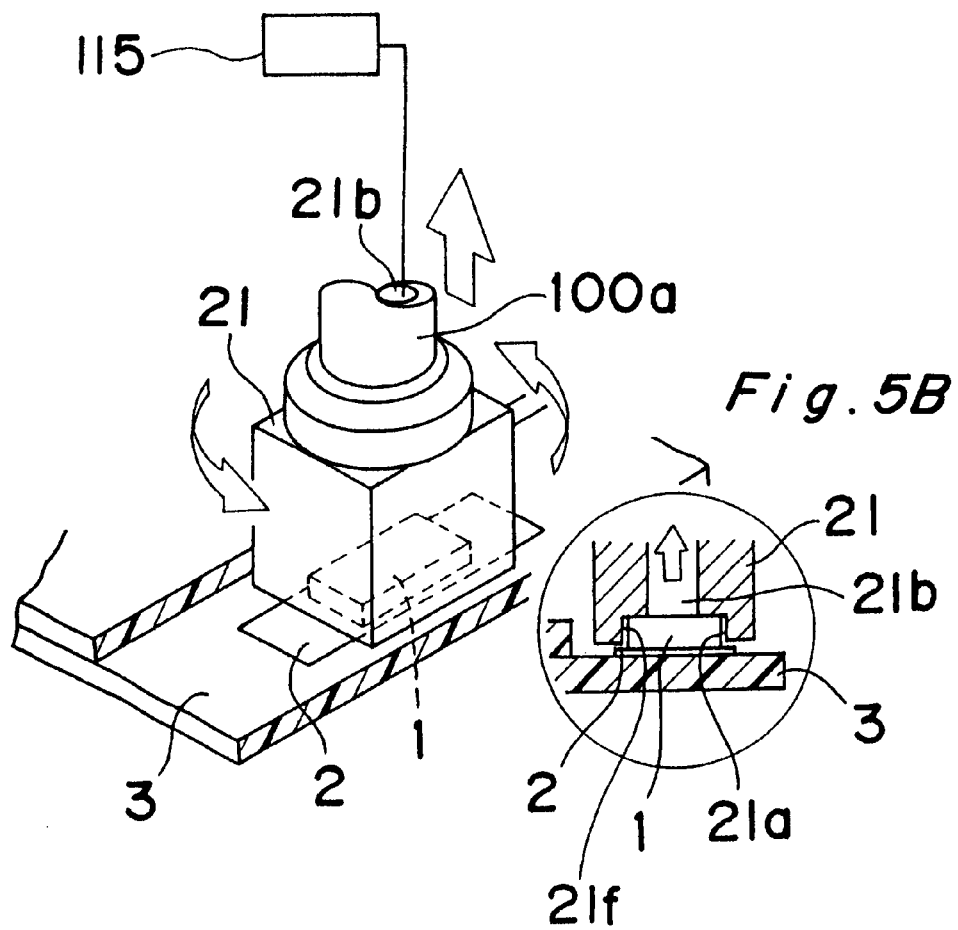
FIG. 5A and FIG. 5B are respectively a schematic perspective view and a partial sectional view showing an IC component separating method according to a second embodiment of the present invention.
Figure 6:
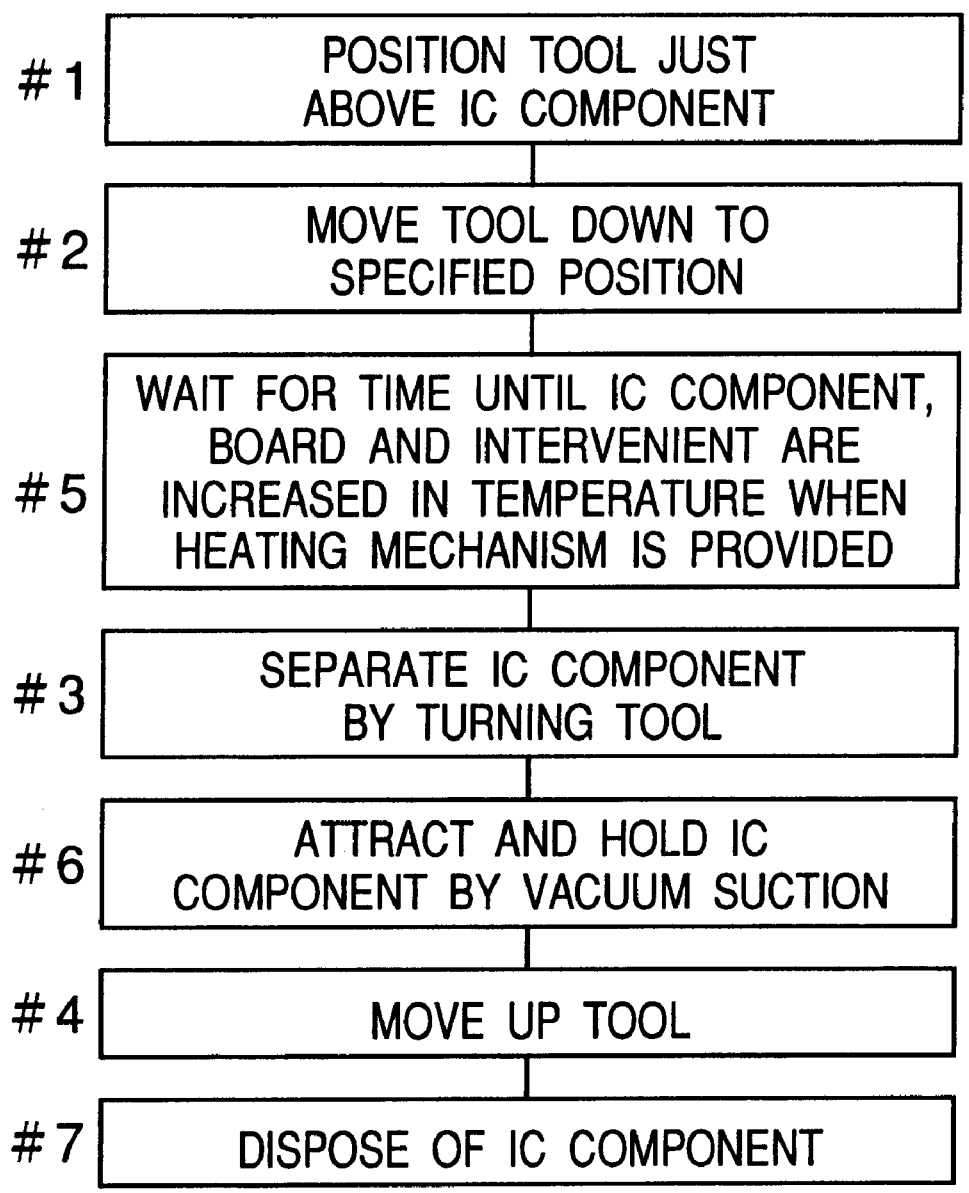
FIG. 6 is a flowchart showing a mounting process of the IC component separating method of the second embodiment.

As shown in FIGS. 5A and 5B, the concave tool 21 is provided with a suction hole 21b connected to a vacuum suction path. This suction hole 21b is connected to a vacuum suction device 115 via the vacuum suction path. Then, as shown in FIG. 6, the IC component 1 is separated by turning the concave tool 21 in step #4, and thereafter the IC component 1 is sucked and held to the concave tool 21 by vacuum suction through the suction hole 21b (step #6). Then, the concave tool 21 is moved up in step #4, and thereafter the concave tool 21 is moved into a specified position to stop the vacuum suction, thereby disposing of the IC component 1 (step #7).

According to the above processes, the same effect and function as those of the first embodiment can be obtained, and the IC component 1 that has been removed and sucked can be discarded and fragments of the IC component 1 can be removed by suction, so that automatization can be achieved for the improvement in work efficiency. Furthermore, the IC component 1 is separated from the board 3 when the IC component 1 is turned, and therefore, the anisotropic conductive film 2 that has adhered on the IC component 1 can be prevented from spattering and adhering onto the board 3 during the turn.

Next, a third embodiment of the present invention will be described next with reference to FIG. 7A, FIG. 7B and FIG. 8. It is to be noted that the same components and procedures as those of the embodiments are denoted by the same reference numerals and no description is provided for them.

Figure 7A:
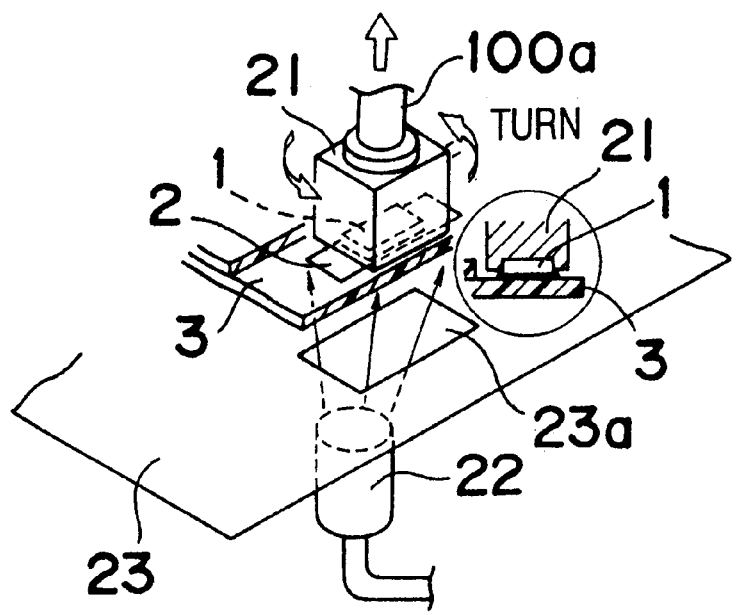
FIG. 7A and FIG. 7B are respectively a schematic perspective view and a partial sectional view showing an IC component separating method according to a third embodiment of the present invention.
Figure 7B:
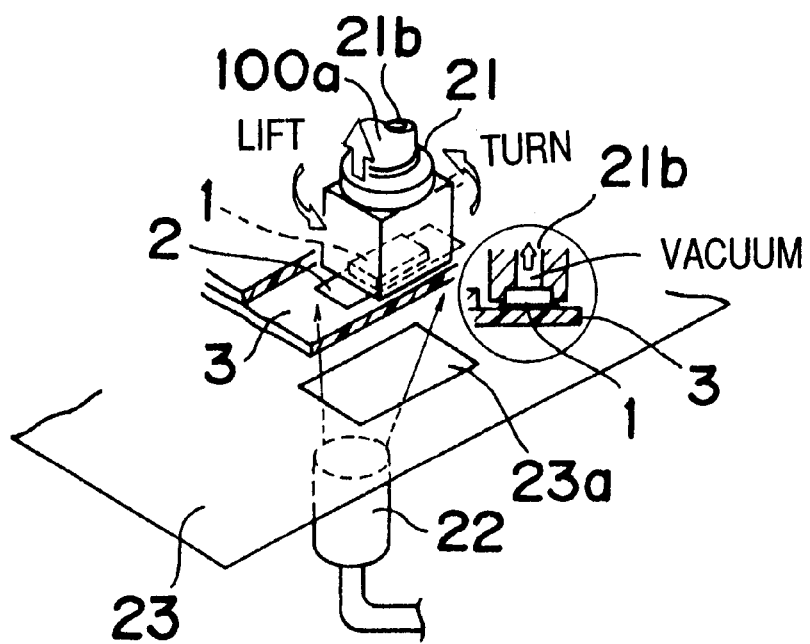

In FIG. 7A, reference numeral 22 denotes an infrared light applying section for applying infrared light, and 23 denotes a shield plate for shielding infrared light, where an opening 23a of an appropriate size for heating the anisotropic conductive film 3 is formed. Also in this third embodiment, the IC component 3 is bonded to the board 1 via a bonding intervenient 6 (or intervening member) such as an anisotropic conductive film 2, conductive paste, or solder.

Figure 8:
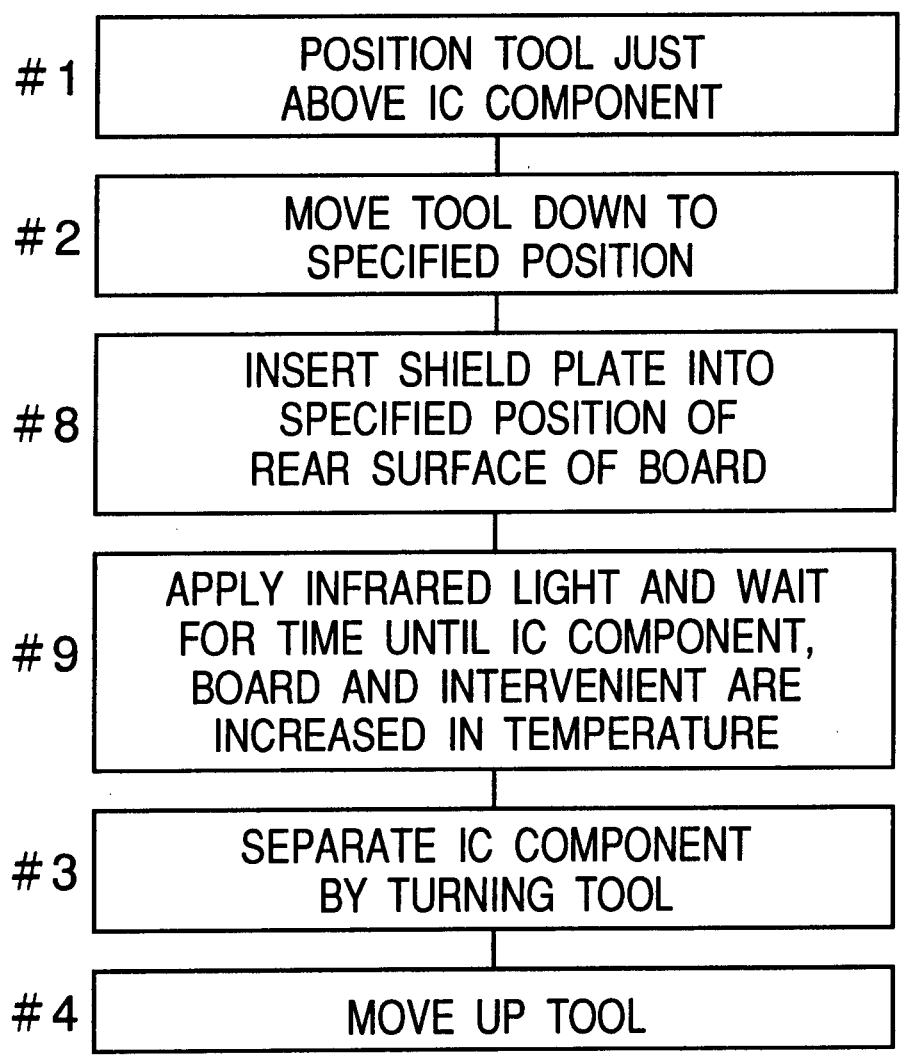
FIG. 8 is a flowchart showing a mounting process of the IC component separating method of the third embodiment.

In this third embodiment, as shown in FIG. 7A and FIG. 8, the infrared light applying section 22 is arranged on the rear surface side of the board 3, and a heated concave tool 21 is moved down to cover the IC component 1 (step #2). In this case, it is acceptable to heat the concave tool 21 by a heater or the like and then heat the IC component 1 and the bonding intervenient 6 through heat conduction by putting the concave tool 21 in contact with the IC component 1. Then, with this operation, the shield plate 23 is inserted between the board 3 and the infrared light applying section 22 (step #8), and infrared light is applied through the opening 23a to the portion of the board 3 where the IC component 1 is mounted (step #9). Next, when the bonding intervenient 6 is softened through heat conduction from the board 3 after a specified time, the concave tool 21 is turned to separate the IC component 1 (step #3) and then the concave tool 21 is moved up to remove the separated IC component 1. In this case, as shown in FIG. 7B, it is, of course, preferable to provide the concave tool 21 with a suction hole 21b and suck the IC component 1.

According to this arrangement, the bonding intervenient 6 is softened through not only the heating of the IC component 1 from its periphery via the concave tool 21 but also heat conduction from the board 3 with the application of infrared light, so that the separating work can be performed more easily. Since only the portion corresponding to the opening 23a can be heated via the shield plate 23, this method can also be applied to a fine IC component 1. When the board 3 is formed of a transparent material such as glass, the infrared light is transmitted through the board 3. Therefore, the softening of the bonding intervenient 6 can be achieved in a shorter time than when softening the bonding intervenient 6 is only achieved only through heat conduction, so that the separation of the IC component 1 can be easily performed.

The insertion of the shield plate into the specified position and the infrared light applying operation are not limited to the steps #8 and #9, and they may be performed before or after positioning the tool 21 just above the IC component 1.

A fourth embodiment of the present invention will be described with reference to FIGS. 9 through 11.

Figure 9:
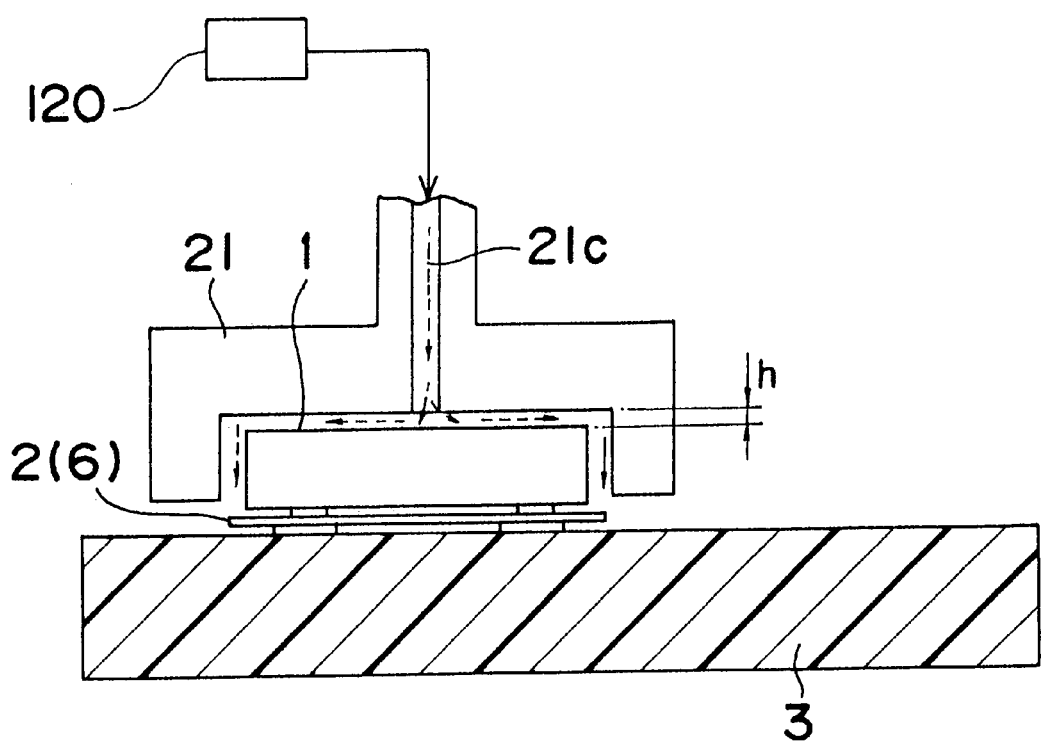
FIG. 9 is a schematic sectional view showing an IC component separating method according to a fourth embodiment of the present invention.
Figure 10:
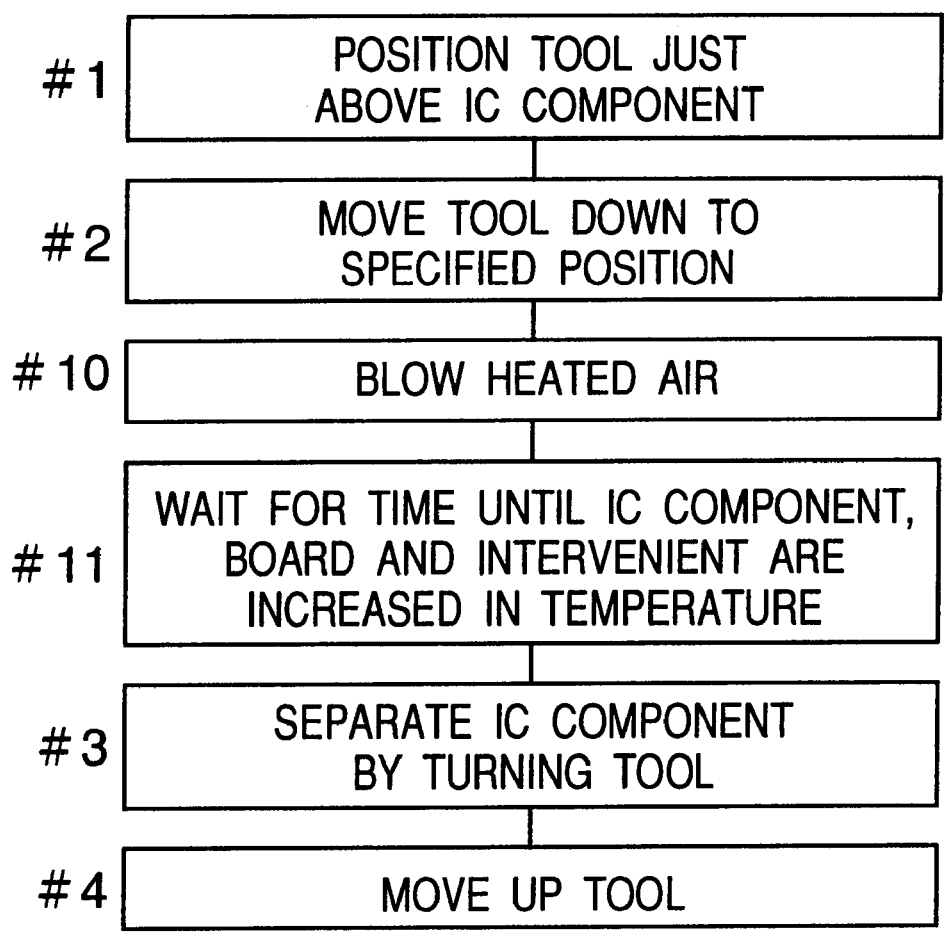
FIG. 10 is a flowchart showing a mounting process of the IC component separating method of the fourth embodiment.

In this embodiment, as shown in FIG. 9, the concave tool 21 is provided with a hole 21c, and heated air can be blown out of a heated air source 120 through the hole 21c to the inside of the concave tool 21. Then, as shown in FIG. 10, the concave tool 21 is moved down to cover the IC component 1 with a gap h provided between the upper surface of the IC component 1 and the inner surface of the concave portion 21a of the tool 21 (step #2), and thereafter heated air is blown from the hole 21c to the inside of the concave tool 21 (step #10), thereby heating the IC component 1 and the bonding intervenient 6 of the board 3 and the IC component 1 with heated air. Next, in a state in which the bonding intervenient 6 is softened by continuing the heating with heated air for a specified time (step #11), the concave tool 21 is turned to separate the IC component 1 (step #3).

Figure 11:
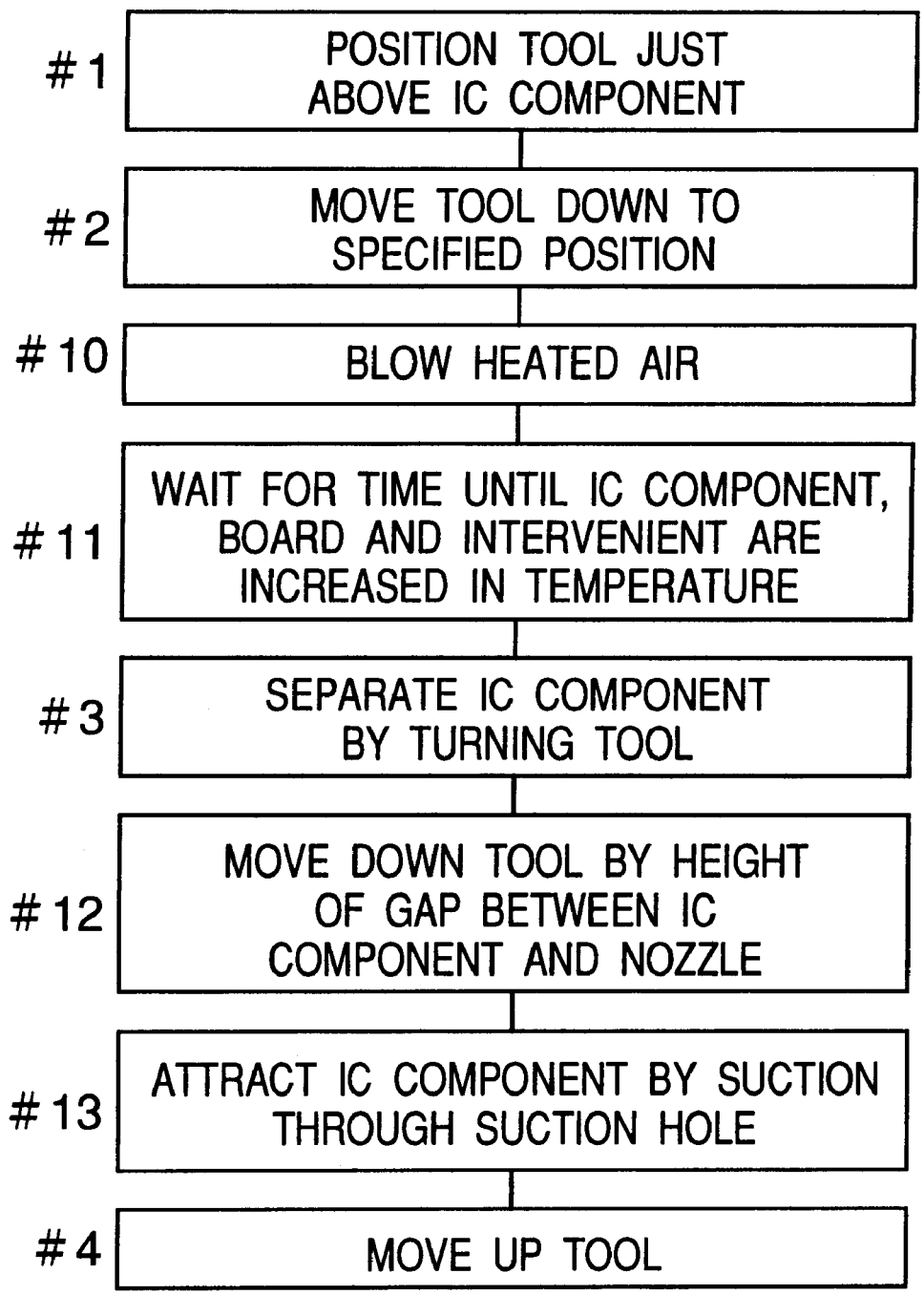
FIG. 11 is a flowchart showing a mounting process of the IC component separating method according to a modification example of the fourth embodiment.

As shown in FIG. 11, it is acceptable to soften the bonding intervenient 6 by blowing heated air (steps #10 and #11), thereafter separating the IC component 1 by turning the tool (step #3), then moving the concave tool 21 down to the gap height h between the IC component 1 and the concave tool 21 as shown in FIG. 8 thereby making the inner surface of the concave portion 21a of the concave tool 21 contact the upper surface of the IC component 1 (step #12), thereafter sucking the IC component 1 by performing vacuum suction from the hole 21c (step #13) and moving up the concave tool 21 thereby discarding the IC component 1. It is to be noted that 20 the timing in accordance with which the concave tool 21 is moved down so as to eliminate the gap h is not limited to the time after the IC component 1 is separated, and the tool 21 may be moved down before the IC component 1 is separated by turning the tool 21.

Particularly, according to this system of blowing heated air from the concave tool 21, heat can be applied to or around only a specified position on the board 3, and therefore, less influence can be exerted on the other components. Even when IC components are stacked in two layers as in the case of BGA and it is difficult to soften or melt the bonding intervenient 6 between the tool and the board 3 through only heat conduction from the concave tool 21, the heated air easily reaches the board 3 and the bonding intervenient 6, so that the IC component 1 can easily be separated.

A fifth embodiment of the present invention will be described next with reference to FIG. 12A, FIG. 12B, FIG. 13A, and FIG. 13B.

Figure 12A:
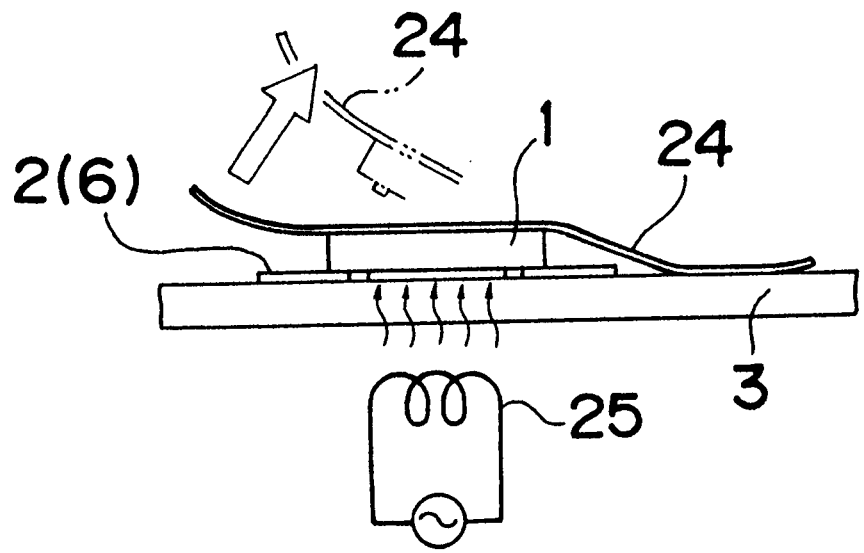
FIG. 12A and FIG. 12B are sectional views showing an IC component separating method according to a fifth embodiment of the present invention.
Figure 13A:
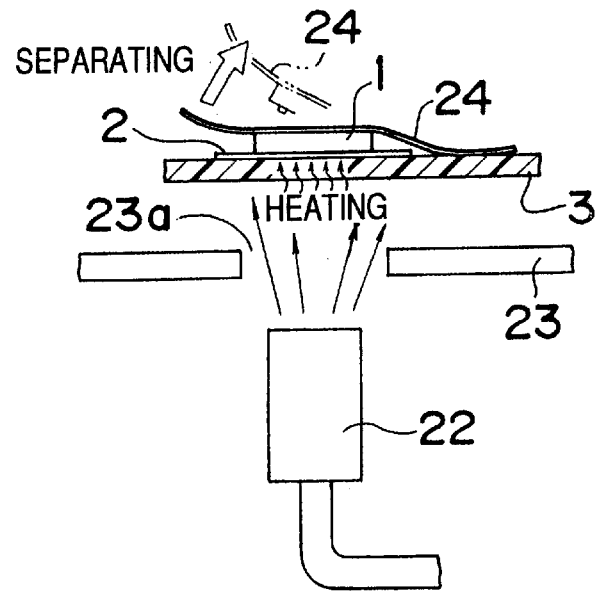
FIG. 13A and FIG. 13B are sectional views showing the IC component separating method according to the fifth embodiment of the present invention.

In this embodiment, as shown in FIG. 12A and FIG. 13A, a tape-shaped adhesive member 24 is attached to the IC component 1 mounted on the board 3 and then the adhesive member 24 is pulled upward, thereby separating the IC component 1 from the bonding intervenient 6 such as an anisotropic conductive film, conductive paste, or solder.

Preferably, as shown in FIG. 12A and FIG. 13A, this separating work can easily be achieved by attaching the tape-shaped adhesive member 24 to the IC component 1 after mounting the IC component 1 on the board 3 and thereafter separating the IC component 1 by applying heat with infrared light to the IC component 1 or its bonding intervenient 6 from the rear surface.

Figure 12B:
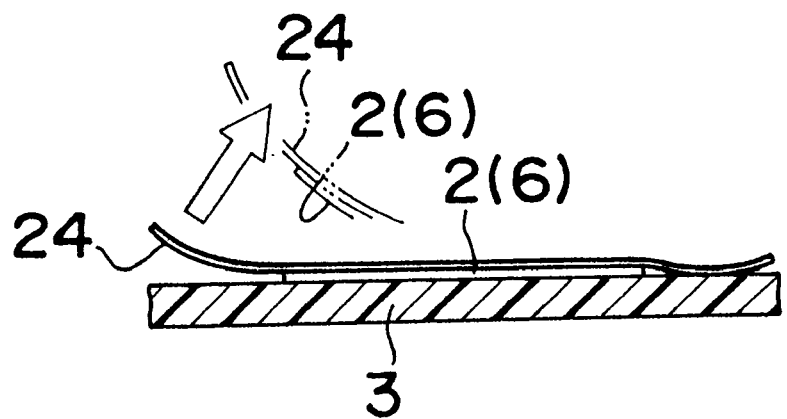
Figure 13B:
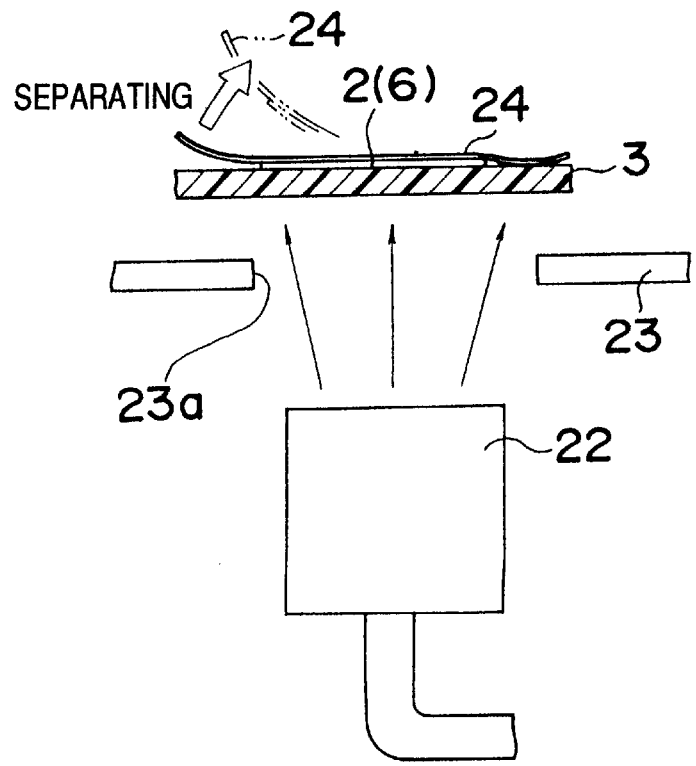

When the anisotropic conductive film 2 is used as the bonding intervenient 6 as shown in FIG. 12B and FIG. 13B, according to the method of attaching the tape-shaped adhesive member 24 to the anisotropic conductive film 2 and separating the component 1 by means of the tape-shaped adhesive member 24 similar to the above case, the disposal of the IC component 1 can easily be performed. When separating and removing the bonding intervenient 6 such as the anisotropic conductive film 2 by the tape, the bonding intervenient 6 can easily be removed without using the repair liquid, cotton swab and so on as described in connection with the prior art nor spattering the bonding intervenient 6.

In each of the aforementioned embodiments, with regard to the shape of the concave tool 21, the tool is only required to be provided with a contact portion such that can turn the IC component 1 relative to the board 3. The present invention is not limited to such a shape that is provided with the four contact portions 21f to contact all the four side surfaces of the IC component 1 and entirely covers the IC component 1 as shown in FIG. 5A and FIG. 5B. The same effect can be obtained by a shape for holding at least two sides out of the four sides of the IC component 1, or, for example, a downwardly C-figured shape having two contact portions 21f to contact two opposite side surfaces of the IC component 1 as shown in FIG. 1A and FIG. 1B.

Figure 16A:
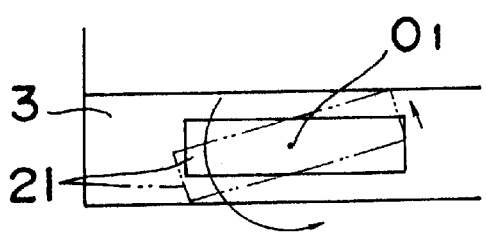
FIG. 16A and FIG. 16B are schematic plan views showing IC component separating methods according to the first embodiment and the sixth embodiment of the present invention.
Figure 16B:
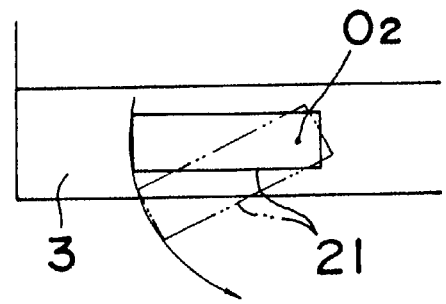
Figures 18A, 18B:
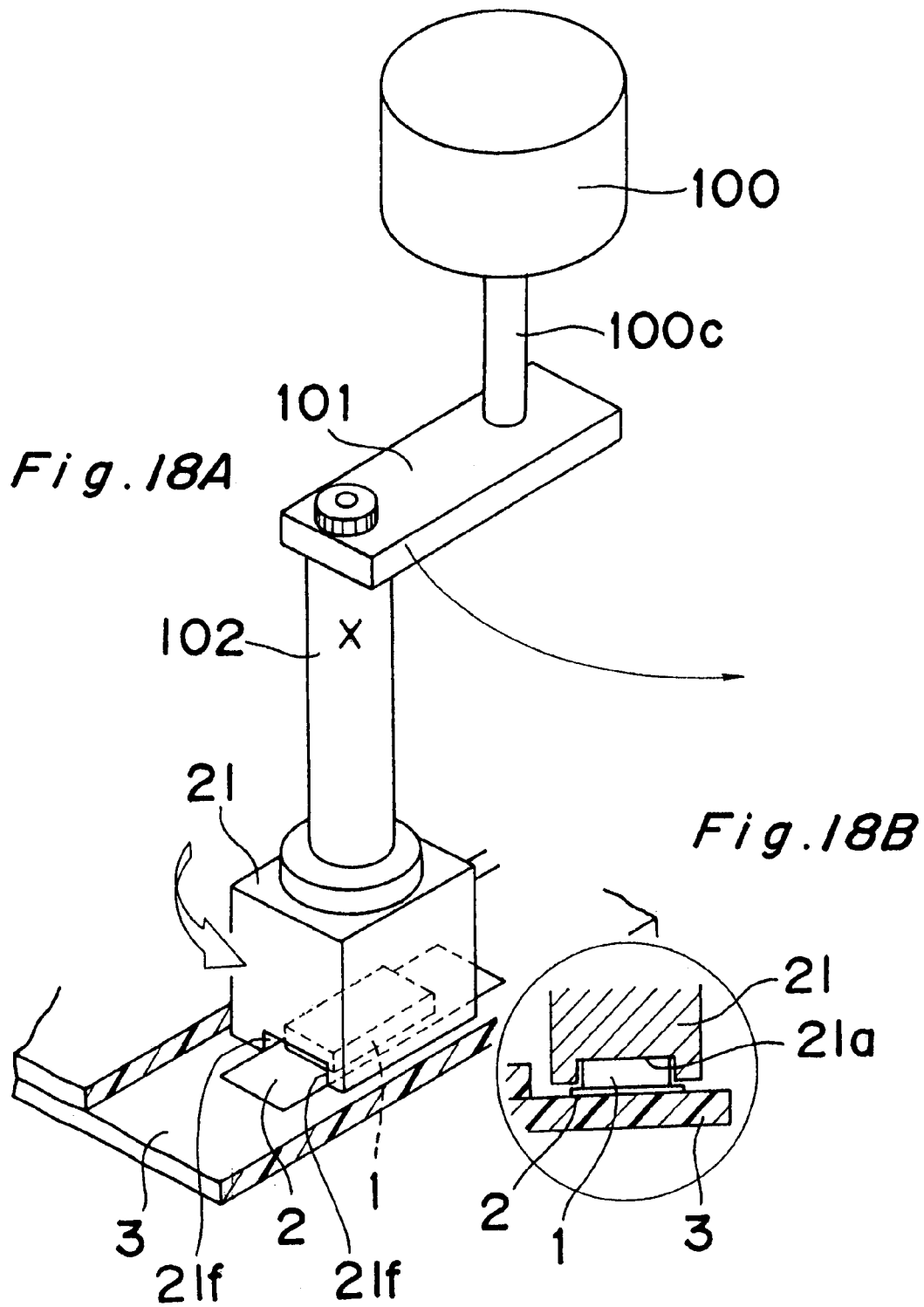
FIG. 18A and FIG. 18B are respectively a schematic perspective view and a partial sectional view showing an IC component separating method according to a modification example of the sixth embodiment.

As shown in FIG. 1A, FIG. 1B, FIG. 5A, FIG. 5B, and FIG. 16A, the present invention is not limited to the tool that turns while making the rotary center $O_1$ of the tool 21 roughly coincide with the center of the IC component 1. It is acceptable to eccentrically turn the IC component 1 by turning the tool 21 while displacing the center of rotation 02 of the tool 21 from the center of the IC component 1 according to a sixth embodiment of the present invention as shown in FIG. 16B, FIG. 17A, and FIG. 17B. Further, as a modification example of the sixth embodiment, as shown in FIG. 18A and FIG. 18B, it is acceptable to employ a link mechanism provided with the rotary shaft 100c of a motor 100, a link 101 whose one end is connected to the rotary shaft 100c, and a shaft 102 connected to the other end of the link 101 and turn the tool 21 eccentrically with respect to the center of the rotary shaft 100c of the motor 100.

Figures 19A, 19B:
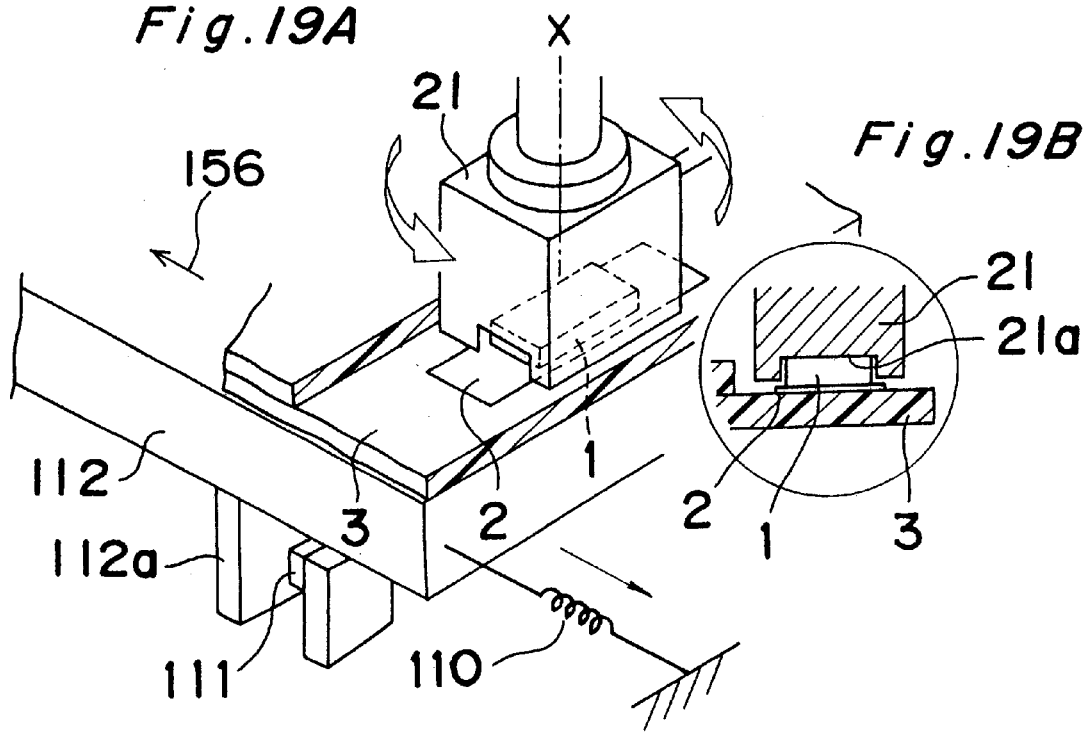
FIG. 19A and FIG. 19B are respectively a schematic perspective view and a partial sectional view showing an IC component separating method according to a seventh embodiment of the present invention.
Figures 20A, 20B:
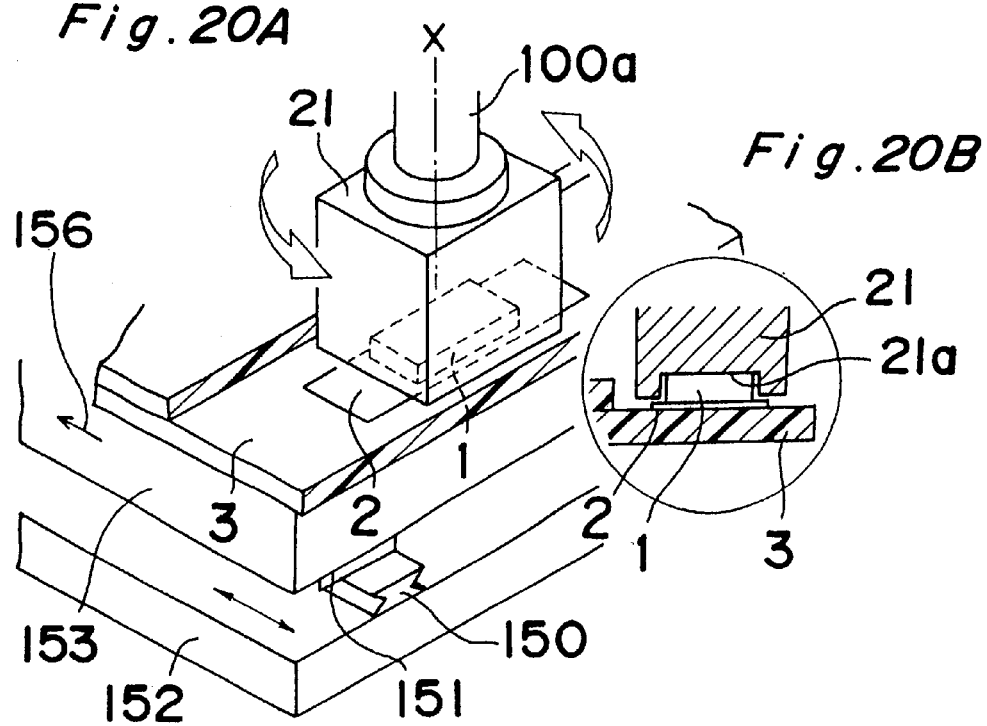
FIG. 20A and FIG. 20B are respectively a schematic perspective view and a partial sectional view showing an IC component separating method according to a modification example of the seventh embodiment.
Figure 21:
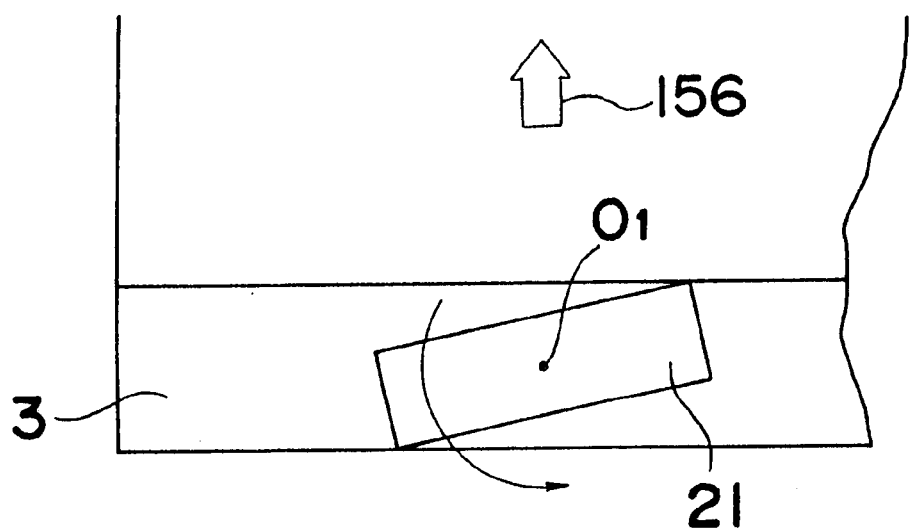
FIG. 21 is a schematic plan view showing the IC component separating methods according to the seventh embodiment and the modification example of the seventh embodiment.

When turning the tool 21 in the above embodiment, the board 3 is, in principle, prevented from being damaged so that the tool 21 does not come in contact with the board 3. It is acceptable to retreat the board 3, or in particular, the board 3 of a LCD or the like when the tool 21 comes in contact with the board 3. As one example, according to a seventh embodiment of the present invention as shown in FIG. 19A, FIG. 19B, and FIG. 21, a board support base 112 for supporting the board 3 is urged by a spring 110 so that a projection 112a of the board support base 112 always contacts a stopper 111 of a fixed base. With this construction, the board 3 may be prevented from being damaged by the tool 21 by retreating as moving the board support base 112 in the direction of arrow 156 against the urging force of the spring 110 when the tool 21 comes in contact with the board 3 in turning the tool 21. As a modification example of the seventh embodiment, as shown in FIG. 20A, FIG. 20B, and FIG. 21, it is acceptable to provide a board support base 153 on a fixed base 152, make the board support base 153 movable by linear ways 150 and 151 that guide the straight movement of the board support base 153, and move the board 3 in the direction 156 in which the board 3 retreats when the tool 21 turns to come in contact with the board 3.

In the aforementioned various embodiments, the drive source for turning the tool 21 is not limited to the motor, and various known drive sources such as a rotary cylinder may be used.

According to the present invention, the tool having the contact portion for contacting the IC component is made to cover the IC component mounted on the board, and this tool is turned so as to twist with respect to the bonded surface on which the IC component is bonded to the board, thereby allowing the IC component to be easily removed from the board without damage to the board. This facilitates easy mounting of another IC component after removing the IC component and causes less damage on the board, therefore improving the reliability.

In heating the tool or by the heating with infrared light, the IC component can be removed without causing damage to the IC component, and the subsequent mounting can easily be achieved, therefore improving the productivity.

According to the system of blowing heated air from the tool, heat can be applied to or around only the specified position on the board, exerting no influence on the other components. When the IC components are stacked in two layers as in the case of BGA or the like, the IC components can easily be separated even when the softening or melting of the bonding intervenient between the components and the board is difficult through heat conduction from the tool.

According to the method of separating the IC component by making the tool attract by suction the IC component and turn while moving up, the IC component is separated from the board while the IC component is turned, and therefore, the bonding intervenient such as the anisotropic conductive film attached to the IC component can be prevented from spattering onto the board during the turn.

According to the method of separating the IC component by means of the tape-shaped adhesive member, the disposal of the IC component can be achieved with each tape, so that the disposal can easily be achieved. When separating and removing the bonding intervenient by means of the tape, the bonding intervenient can easily be removed without using the repair liquid, cotton swab and so on as described in connection with the prior art.

The entire disclosure of Japanese Patent Application No. 8-93708 filed on Apr. 16, 1996, including specification, claims, drawings, and summary are incorporated herein by reference in its entirety.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An IC component separating method for separating an IC component mounted on a board via an intervening bonding member, the method comprising:

contacting the IC component mounted on the board with at least a pair of opposite contact surfaces of a tool;

heating the IC component or a bonded portion of the IC component and the board so as to soften the intervening bonding member; and separating the IC component from the board by rotating the tool so as to twist the IC component relative to a bonded surface on which the IC component is bonded to the board, wherein a center of rotation of the tool is eccentric relative to a center of the IC component when separating the IC component from the board while turning the tool.

2. An IC component separating method as claimed in claim 1, wherein the intervening bonding member is an anisotropic conductive film.

3. An IC component separating method as claimed in claim 1, further comprising heating the tool such that the IC component or the bonded portion of the IC component and the board are heated by means of heat conducted from the tool when the contact surfaces contact the IC component.

4. An IC component separating method as claimed in claim 1, further comprising vacuum suctioning the IC component to attract the IC component to the tool while separating the IC component from the board.

5. An IC component separating method as claimed in claim 1, wherein the IC component or the bonded portion of the IC component and the board is heated with infrared light projected to a rear surface of an IC component mounting surface of the board when separating the IC component from the board.

6. An IC component separating method as claimed in claim 5, wherein the infrared light is projected from an infrared light applying device through an opening in a shield plate that is arranged between the infrared light applying device and the board, and the infrared light is projected, through the opening, only onto the bonded portion.

7. An IC component separating method for separating an IC component mounted on a board via an intervening bonding member, the method comprising:
 contacting the IC component mounted on the board with at least a pair of opposite contact surfaces of a tool;
 heating the IC component or a bonded portion of the IC component and the board so as to soften the intervening bonding member;
 separating the IC component from the board by turning the tool so as to twist the tool relative to a bonded surface on which the IC component is bonded to the board; and
 moving the board so that the board does not hinder the turning operation of the tool when the tool comes in contact with the board during the turning of the tool so as to separate the IC component from the board.

8. An IC component separating method as claimed in claim 7, wherein the intervening bonding member is an anisotropic conductive film.

9. An IC component separating method as claimed in claim 7, further comprising heating the tool such that the IC component or the bonded portion of the IC component and the board are heated by means of heat conducted from the tool when the contact surfaces contact the IC component.

10. An IC component separating method as claimed in claim 7, further comprising vacuum suctioning the IC component to attract the IC component to the tool when separating the IC component from the board.

11. An IC component separating method as claimed in claim 7, wherein the IC component or a bonded portion of the IC component and the board is heated with infrared light projected to a rear surface of an IC component mounting surface of the board when separating the IC component from the board.

12. An IC component separating method as claimed in claim 11, wherein the infrared light is projected from an infrared light applying device through an opening in a shield plate that is arranged between the infrared light applying device and the board, and the infrared light is projected through the opening to only the bonded portion.

13. An IC component separating method for separating an IC component mounted on a board via an intervening bonding member, the method comprising:
 contacting the IC component mounted on a board with at least a pair of opposite contact surfaces of a tool;
 heating the tool such that the IC component or the bonded portion of the IC component and the board are heated by means of heat conducted from the tool when the contact surfaces contact the IC component so as to soften the intervening bonding member;
 heating the IC component or the bonded portion of the IC component and the board with infrared light projected onto a rear surface of an IC component mounting surface of the board when separating the IC component from the board; and
 separating the IC component from the board by turning the tool so as to twist the IC component relative to a bonded surface on which the IC component is bonded to the board.

14. An IC component separating method as claimed in claim 13, wherein the infrared light is projected from an infrared light applying device through an opening in a shield plate that is arranged between the infrared light applying device and the board, and the infrared light is projected through the opening to only the bonded portion.

15. An IC component separating apparatus for separating an IC component from a board, said apparatus comprising:
 a tool having a contact portion for contacting the IC component, said tool being movable in a direction toward and away from the board on which the IC component is mounted, said tool being able to rotate so as to twist the IC component relative to a bonded surface on which the IC component is bonded to the board; and
 a heating device for heating the IC component or an intervening bonding member bonding the IC component to the board,
 wherein the contact portion of said tool is formed so as to contact the IC component mounted on the board, the intervening bonding member is softened by heating the IC component or a bonded portion of the IC component and the board by means of said heating device, and the IC component is separated from the board by rotating said tool so as to twist the IC component with respect to the bonded surface on which the IC component is bonded to the board, and
 wherein a center of rotation of said tool is eccentric relative to a center of the IC component when separating the IC component from the board while rotating the tool.

16. An IC component separating apparatus as claimed in claim 15, wherein said heating device is provided for heating the tool so that the IC component or the bonded portion of the IC component and the board is heated through heat conduction from the tool.

17. An IC component separating apparatus as claimed in claim 16, wherein said heating device comprises an infrared light applying device for heating the IC component and the intervening bonding member of the IC component with infrared light from a rear surface of the board.

18. An IC component separating apparatus as claimed in claim 16, wherein said tool is provided with a suction device that is capable of producing a negative pressure inside of said tool to suck the IC component or the intervening bonding member.

19. An IC component separating apparatus as claimed in claim 16, wherein a center of rotation of said tool is eccentric relative to a center of the IC component when separating the IC component from the board while rotating the tool.

20. An IC component separating apparatus for separating an IC component from a board, said apparatus comprising:
- a tool having a contact portion for contacting the IC component, said tool being movable in a direction toward and away from the board on which the IC component is mounted, said tool being able to rotate so as to twist the IC component relative to a surface on which the IC component is bonded to the board;
- a heating device for heating the IC component or an intervening bonding member that bonds the IC component to the board,
- wherein the contact portion of said tool is formed so as to contact the IC component mounted on the board, the intervening bonding member is softened by heating the IC component or a bonded portion of the IC component and the board by means of said heating device, and the IC component is separated from the board by turning the tool so as to twist the IC component with respect to the surface on which the IC component is bonded to the board; and
- a retreating mechanism for moving the board so that the board does not hinder the turning operation of said tool when the tool comes into contact with the board while the tool turns to separate the IC component from the board.

21. An IC component separating apparatus as claimed in claim 20, wherein said heating device is provided for heating the tool so that the IC component or the bonded portion of the IC component and the board can be heated through heat conducted from said tool.

22. An IC component separating apparatus as claimed in claim 21, wherein said heating device comprises an infrared light applying device for heating the IC component and the intervening bonding member of the IC component with infrared light from a rear surface of the board.

23. An IC component separating apparatus as claimed in claim 20, wherein said tool is provided with a suction device that is capable of producing a negative pressure inside of said tool and sucking the IC component or the intervening bonding member.

* * * * *